(12) United States Patent
Rock et al.

(10) Patent No.: US 8,906,597 B2
(45) Date of Patent: Dec. 9, 2014

(54) LAYERED RADIATION-SENSITIVE MATERIALS WITH VARYING SENSITIVITY

(75) Inventors: Jeffrey A. Rock, Fairport, NY (US); Gerald W. Fly, Geneseo, NY (US); Yeh-Hung Lai, Webster, NY (US); Keith E. Newman, Pittsford, NY (US); Alan J. Jacobsen, Pacific Palisades, CA (US); William B. Carter, Santa Monica, CA (US); Peter D. Brewer, Westlake Village, CA (US)

(73) Assignee: GM Global Technology Operations LLC, Detroit, MI (US)

(*) Notice: Subject to any disclaimer, the term of this patent is extended or adjusted under 35 U.S.C. 154(b) by 1248 days.

(21) Appl. No.: 12/339,308

(22) Filed: Dec. 19, 2008

(65) Prior Publication Data

US 2010/0159398 A1 Jun. 24, 2010

(51) Int. Cl.
*G03F 7/26* (2006.01)
*G03F 7/095* (2006.01)
*G03F 7/20* (2006.01)

(52) U.S. Cl.
CPC .............. *G03F 7/095* (2013.01); *G03F 7/2022* (2013.01)
USPC .......................................... 430/322; 430/325

(58) Field of Classification Search
CPC ............ H01L 21/0273; H01L 21/0274; H01L 21/0271; G03F 7/094; G03F 7/26
USPC ................................................ 430/322, 325
See application file for complete search history.

(56) References Cited

U.S. PATENT DOCUMENTS

| | | | |
|---|---|---|---|
| 4,557,797 A | 12/1985 | Fuller et al. | |
| 4,657,629 A | 4/1987 | Bigelow | |
| 4,670,090 A | 6/1987 | Sheng et al. | |
| 4,770,739 A | 9/1988 | Orvek et al. | |
| 4,820,609 A * | 4/1989 | Iwadate et al. | 430/270.1 |
| 5,731,126 A * | 3/1998 | Takemura et al. | 430/270.1 |
| 6,274,288 B1 | 8/2001 | Kewitsch et al. | |
| 6,455,227 B1 * | 9/2002 | Hara | 430/273.1 |
| 7,382,959 B1 | 6/2008 | Jacobsen | |
| 2002/0001777 A1 * | 1/2002 | Kido | 430/313 |
| 2006/0210819 A1 * | 9/2006 | Dueber | 428/474.4 |
| 2008/0214011 A1 * | 9/2008 | Colburn et al. | 438/708 |

OTHER PUBLICATIONS

Microstereolithography: Concepts and applications; Arnaud Bertsch, Paul Bernhard, Philippe Renaud; (c) 2001 IEEE.
Microstereolithography: a Review; Arnard Bertsch, Sebastien Jiguet, Paul Bernhard, Philippe Renaud; Swiss Federal Institute of Technology,(c) 2003 Material Research Society.
Characterisation of Epoxy Resins for Microstereolithographic Rapid Prototyping; C.R. Chatwin, M. Farsari, S. Huang, M.I. Heywood, R.C.D. Young, P.M. Birch, F. Claret-Tournier and J.D. Richardson, School of Engineering, University of Sussex, Falmer, Brighton, UK; (c) 1999 Springer-Verlag London Limited.
Two-Photon Photopolymerization and 3D Lithographic Microfabrication; Hong-Bo Sun, Satoshi Kawata; Depart of Applied Physics, Osaka University, Japan; APS (2004) (c) Springer-Verlag 2004.
Fabrication and moulding of cellular materials by rapid prototyping; J. Stampfl, H. Houad and S. Seidler; Institute of Material Science and Testing, Vienna University of Technology, Austria; R Liska and F. Schwager; Institute of Applied Synthetic Chemistry, Vienna University of Technology, Austria; A Woesz and P Fratzl; Max Planck Institute of Colloids and Interfaces, Germany; Int. J. Materials and Product Technology, vol. 21, No. 4, 2004, (c) Inderscience Enterprises Ltd.
Acta Materialia 55 (2007) 6724-6733, Compression behavior of micro-scale truss structures formed from self-propagating polymer waveguides; Alan J. Jacobsen, William Barvosa-Carter, Steven Nutt. Published by Elsevier Ltd.

* cited by examiner

*Primary Examiner* — Daborah Chacko Davis
(74) *Attorney, Agent, or Firm* — Fraser Clemens Martin & Miller LLC; J. Douglas Miller

(57) ABSTRACT

A method for fabricating a radiation-cured structure is provided. The method includes the steps of providing a first radiation-sensitive material and applying a second radiation-sensitive material to the first radiation-sensitive material. The first radiation-sensitive material has a first sensitivity. The second radiation-sensitive material has a second sensitivity different from the first sensitivity. At least one mask is placed between at least one radiation source and the first and second radiation-sensitive materials. The mask has a plurality of substantially radiation-transparent apertures. The first and second radiation-sensitive materials are then exposed to a plurality of radiation beams through the radiation-transparent apertures in the mask to form a first construct in the first radiation-sensitive material and a second construct in the second radiation-sensitive material. The first construct and the second construct cooperate to form the radiation-cured structure.

17 Claims, 3 Drawing Sheets

US 8,906,597 B2

LAYERED RADIATION-SENSITIVE MATERIALS WITH VARYING SENSITIVITY

FIELD OF THE INVENTION

Figure 1:
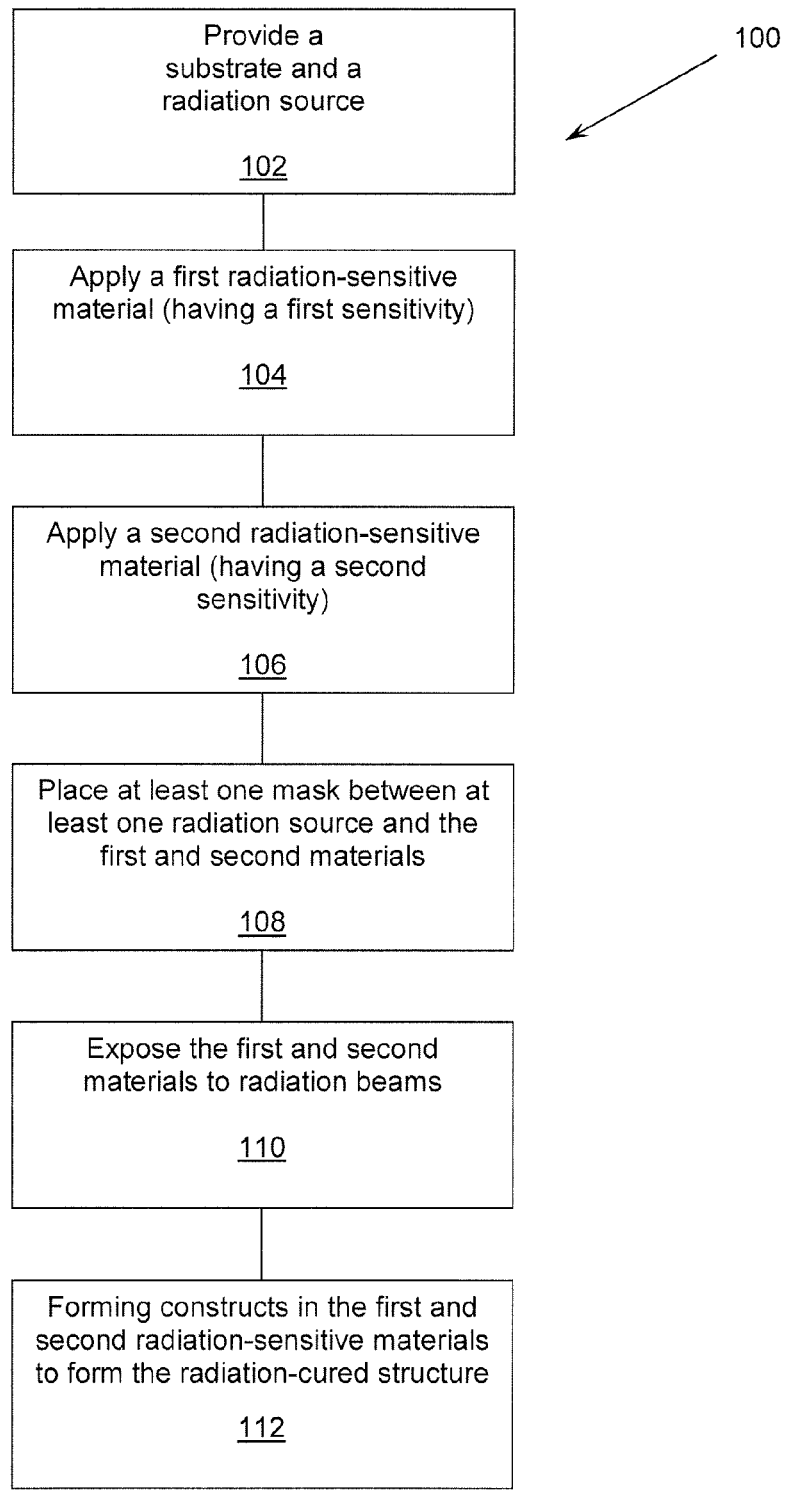

The present disclosure relates to radiation-cured materials and more particularly to a method for fabricating radiation-cured materials with complex structures.

BACKGROUND OF THE INVENTION

Radiation-cured microstructures have been described by Jacobsen et al. in "Compression behavior of micro-scale truss structures formed from self-propagating polymer waveguides", Acta Materialia 55, (2007) 6724-6733, the entire disclosure of which is hereby incorporated herein by reference. One method and system of creating polymer materials with ordered microtruss structures is disclosed by Jacobsen in U.S. Pat. No. 7,382,959, the entire disclosure of which is hereby incorporated herein by reference. The system includes at least one collimated light source selected to produce a collimated light beam; a reservoir having a photo-monomer adapted to polymerize by the collimated light beam; and a mask having at least one aperture and positioned between the at least one collimated light source and the reservoir. The at least one aperture is adapted to guide a portion of the collimated light beam into the photo-monomer to form the at least one polymer waveguide through a portion of a volume of the photo-monomer. Microtruss materials produced by the method and system are further disclosed by Jacobsen in U.S. patent application Ser. No. 11/801,908, the entire disclosure of which is hereby incorporated herein by reference. A polymer material that is exposed to radiation and results in a self-focusing or self-trapping of light by formation of polymer waveguides is also described by Kewitsch et al. in U.S. Pat. No. 6,274,288, the entire disclosure of which is hereby incorporated herein by reference.

Products formed by bilayer resist processes have also been described, for example, by Orvek et al. in U.S. Pat. No. 4,770,739, the entire disclosure of which is hereby incorporated herein by reference. A first resist material sensitive to near UV or violet light is deposited over the top surface of a body. A second resist material sensitive to deep UV light is deposited over the first resist material. The second resist material is exposed to patterned illumination of deep UV light, and then exposed areas removed. The first resist material is illuminated by a flood or blanket exposure of near UV or violet light. The bilayer resist product is thereby formed.

Further known methods for fabricating microstructures include rapid prototyping technology, such as stereolithography, fused deposition modeling, and LIGA (a German acronym for Lithography, Electroplating, and Molding). A particular rapid prototyping technology for manufacturing microstructures is known as electrochemical fabrication, for example, EFAB™ developed by Microfabrica Inc. located in Van Nuys, Calif. The electrochemical fabrication process typically begins by depositing a sacrificial material onto a blank substrate in a desired pattern. The sacrificial material supports the microstructure, like scaffolding, during the fabrication process. A structural material is then deposited onto the sacrificial material. The sacrificial and structural materials are then precisely planarized, and the process repeated until the microstructure is fully assembled. The sacrificial material is ultimately removed, for example, by a highly selective etching procedure to leave the completed microstructure formed from the structural material. The use of electrochemical fabrication facilitates the manufacturing of microstructures with an extraordinary level of geometrical complexity, including the ability to create assemblies out of separate, independently-formed components. However, electrochemical fabrication and other conventional rapid prototyping methods are undesirably expensive and time consuming, particularly for applications such as automotive fuel cells.

There is a continuing need for a method for fabricating radiation-cured structures that is less expensive and time consuming in comparison to conventional rapid-prototyping methods. Desirably, the method facilitates the cost-effective formation of radiation-cured components for fuel cell and other applications.

SUMMARY OF THE INVENTION

In concordance with the instant disclosure, a method for fabricating radiation-cured structures that is less expensive and time consuming in comparison to conventional rapid-prototyping methods, and that facilitates the cost-effective formation of radiation-cured fuel cell components for fuel cell and other applications, is surprisingly discovered.

In a first embodiment, a method for fabricating a radiation-cured structure includes the steps of providing a first radiation-sensitive material, and applying a second radiation-sensitive material to the first radiation-sensitive material. The first radiation-sensitive material has a first sensitivity. The second radiation-sensitive material has a second sensitivity different from the first sensitivity. At least one mask is placed between at least one radiation source and the radiation-sensitive materials. The mask has a plurality of substantially radiation-transparent apertures formed therein. The first and second radiation-sensitive materials are then exposed to a plurality of radiation beams through the radiation-transparent apertures in the at least one mask to form a first construct in the first radiation-sensitive material and a second construct in the second radiation-sensitive material. The first construct and the second construct cooperate to form the radiation-cured structure.

In another embodiment, a method for fabricating a radiation-cured structure, includes the steps of: providing a first radiation-curable material, the first radiation-curable material having a first sensitivity including at least one of a first curing rate, a first initiation rate, a sensitivity to a first radiation frequency, a sensitivity to a first radiation amplitude, and a sensitivity to a first radiation type; applying a second radiation-curable material to the first radiation-curable material, the second radiation-curable material having a second sensitivity including at least one of a second curing rate, a second initiation rate, a sensitivity to a second radiation frequency, a sensitivity to a second radiation amplitude, and a sensitivity to a second radiation type, the second sensitivity different from the first sensitivity; placing at least one mask between at least one radiation source and the first and second radiation-curable materials, the mask having a plurality of substantially radiation-transparent apertures formed therein; and exposing the first and second radiation-curable materials to a plurality of radiation beams through the radiation-transparent apertures in the mask to form a first construct in the first radiation-curable material and a second construct in the second radiation-curable material. The first construct and the second construct cooperate to form the radiation-cured structure.

In a further embodiment, a method for fabricating a radiation-cured structure, includes the steps of: providing a first radiation-dissociable material, the first radiation-dissociable material having a first sensitivity including at least one of a first dissociation rate, a sensitivity to a first radiation frequency, a sensitivity to a first radiation amplitude, and a sensitivity to a first radiation type; applying a second radiation-dissociable material to the first radiation-dissociable material, the second radiation-dissociable material having a second sensitivity including at least one of a second dissociation rate, a sensitivity to a second radiation frequency, a sensitivity to a second radiation amplitude, and a sensitivity to a second radiation type, the second sensitivity different from the first sensitivity; placing a mask between an at least one radiation source and the first and second radiation-dissociable materials, the mask having a plurality of substantially radiation-transparent apertures formed therein; and exposing the first and second radiation-dissociable materials to a plurality of radiation beams through the radiation-transparent apertures in the mask to form a first construct in the first radiation-dissociable material and a second construct in the second radiation-dissociable material. The first construct and the second construct cooperate to form the radiation-cured structure.

DRAWINGS

The above, as well as other advantages of the present disclosure, will become readily apparent to those skilled in the art from the following detailed description, particularly when considered in the light of the drawings described herein.

Figure 2:
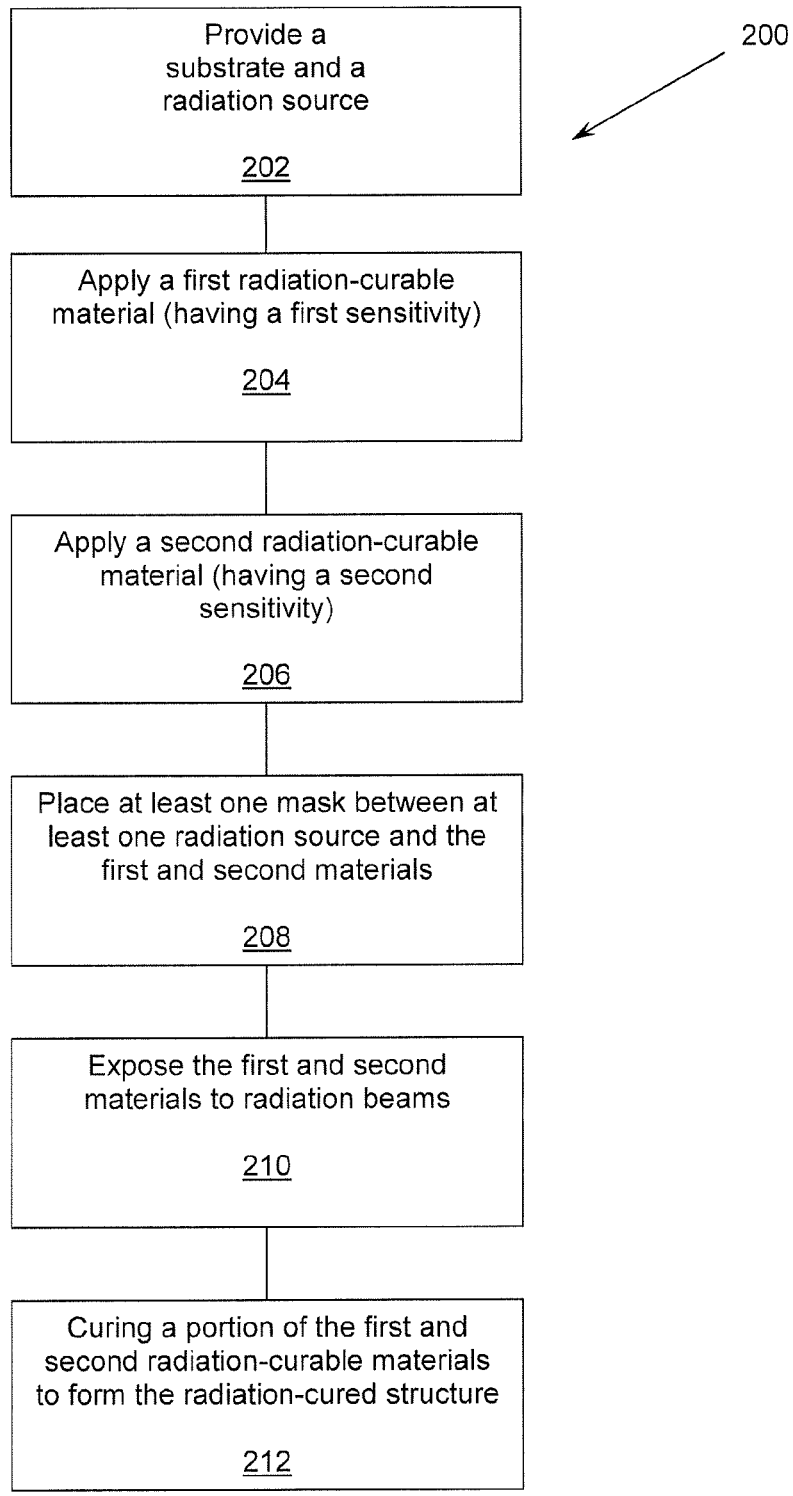
Figure 3:
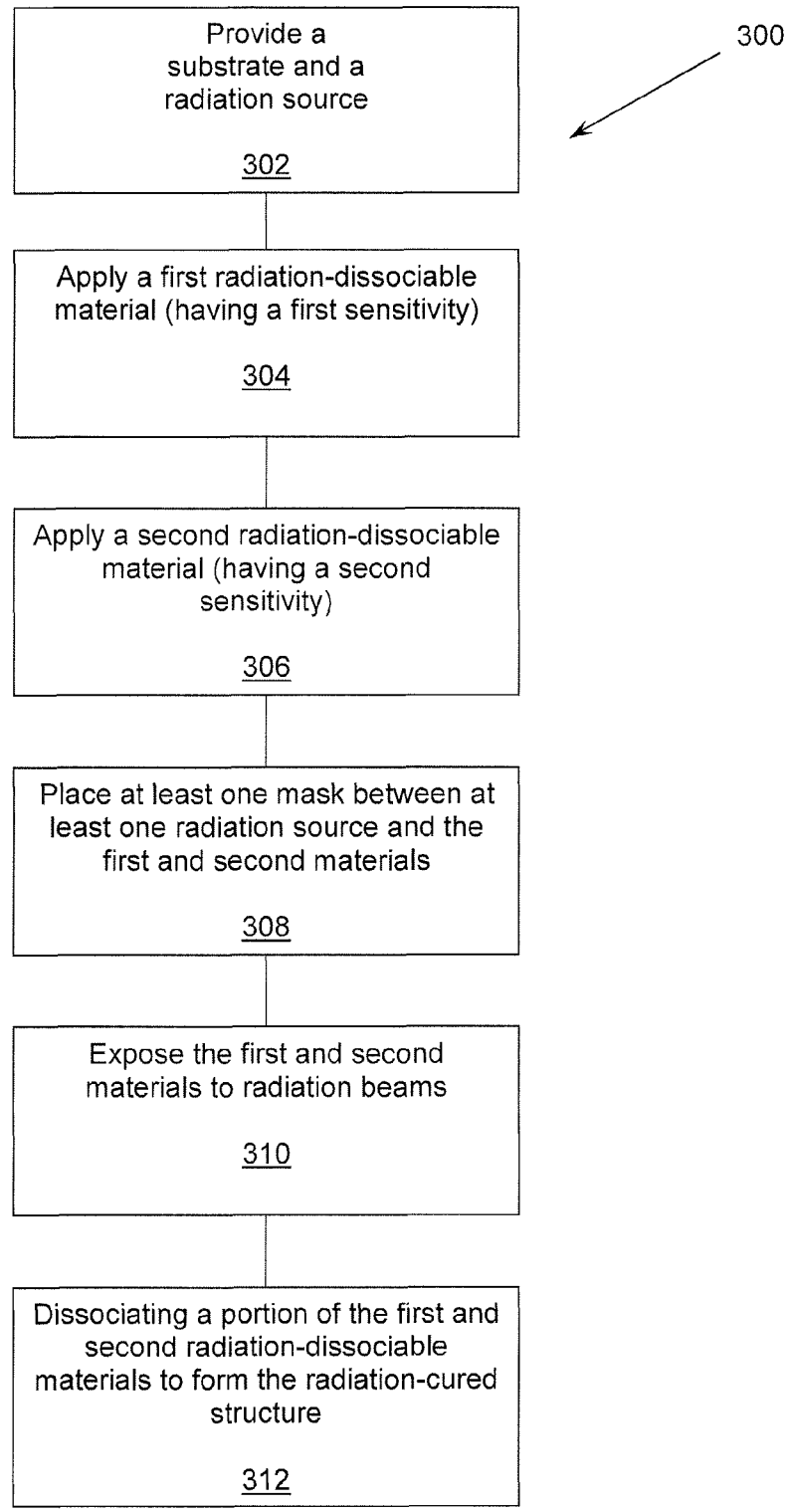

FIG. 1 is a schematic flow diagram of a method for fabricating a radiation-cured microstructure according to one embodiment of the present disclosure, showing formation of the radiation-cured microstructure from radiation-sensitive materials with different sensitivities;

FIG. 2 is a schematic flow diagram of a method for fabricating a radiation-cured microstructure according to another embodiment of the present disclosure, showing formation of the radiation-cured microstructure from radiation-curable materials with different sensitivities; and FIG. 3 is a schematic flow diagram of a method for fabricating a radiation-cured microstructure according to a further embodiment of the present disclosure, showing formation of the radiation-cured microstructure from radiation-dissociable materials with different sensitivities.

DETAILED DESCRIPTION OF THE INVENTION

The following detailed description and appended drawings describe and illustrate various embodiments of the invention. The description and drawings serve to enable one skilled in the art to make and use the invention, and are not intended to limit the scope of the invention in any manner. In respect of the methods disclosed, the steps presented are exemplary in nature, and thus, are not necessary or critical.

As shown in FIG. 1, the present disclosure includes a method 100 for fabricating a radiation-cured structure from at least a first radiation-sensitive material and a second radiation-sensitive material. The radiation-cured structure is formed from a plurality of radiation-cured constructs that are individually formed in each of the first and second radiation-sensitive materials from a plurality of radiation-cured elements or construct features. The radiation-cured constructs formed in each of the first and second radiation-cured materials cooperate to form the radiation-cured structure.

The method 100 may first include the step of providing 102 a substrate. The substrate may be formed from any material that permits the formation of polymeric structures thereon. In certain embodiments, the substrate is a substantially planar sheet. A skilled artisan should appreciate that the substrate may be shaped, however, to provide the radiation-cured structure having the desired shape. The substrate may be electrically nonconductive such as plastic, or electrically conductive such as stainless steel. The substrate may have holes formed therein that facilitate a removal of excess uncured radiation-sensitive material following the fabrication of the radiation-cured structure.

The substrate may further be provided with a coating or surface treatment for bonding and debonding from the radiation-cured structure. As a nonlimiting example, the substrate may have a coating adapted to bond with the uncured radiation-sensitive material. The surface treatment may further facilitate a debonding of a cured polymer from the substrate. In particular, a backside of the substrate is disposed on a flat surface or a stationary base plate during fabrication of the radiation-cured structure and has a coating to militate against an undesired contamination or plating of the substrate, for example, with repeated use. The stationary base plate may be a porous vacuum chuck having a pressure-facilitated release, for example, for selectively holding the substrate in place during the fabrication process. A skilled artisan may select suitable surface treatments, including coatings, as desired.

The method 100 further includes the step of applying 104 the first radiation-sensitive material to the substrate, and the step of applying 106 the second radiation-sensitive material to the first radiation-sensitive material. It should be appreciated that the first radiation-sensitive material may be provided, for example, as a free standing film with no substrate in lieu of the step of providing 102 the substrate as described hereinabove. The step of applying 104, 106 the first and second radiation-sensitive materials may alternatively include prelaminating the first and second radiation-sensitive materials and applying the prelaminated first and second radiation-sensitive materials to the substrate.

The radiation sensitive materials according to the present disclosure include radiation-curable materials and radiation-dissociable materials. The term "radiation-curable material" is defined herein as any material that is at least one of initiated, polymerized, and crosslinked by exposure to radiation. It should be appreciated that an increase in temperature may also be employed to at least partially complete polymerization or crosslinking of the radiation-curable materials following an initiation by the exposure to radiation. The term "radiation-dissociable material" is defined herein as any material that exhibits at least one of a scissioning of the polymer backbone and a decrosslinking by exposure to radiation. As a nonlimiting example, the radiation-dissociable material may be made solvent-soluble by a sufficient breakage of crosslinks and/or scissioning of the polymer backbone of the radiation-dissociable material.

As nonlimiting examples, the radiation-curable materials may include one of a liquid photomonomer and a substantially solid radiation-curable polymer. The liquid photomonomer may be a monomer as described by Jacobsen in U.S. Pat. No. 7,382,959 and U.S. application Ser. No. 11/801,908. Further nonlimiting examples of suitable photomonomers include monomers that polymerize via free-radical polymerization when exposed to UV radiation (wavelength between about 250 nm and about 400 nm). The photomonomer may include any suitable free-radical photopolymer material such as urethanes (polyurethanes), acrylates, methacrylates, and cationic polymers such as photo-cured epoxies. Suitable liquid photomonomers may exhibit a shift in index of refraction upon photopolymerization, for example, to provide self-propagating waveguides. Other photomonomers may also be employed, as desired.

Suitable substantially solid radiation-curable polymers may include negative resist polymers. Negative resist polymers go through a photoinitiation process that leads to a curing of the negative resist polymer by polymerization or polycondensation, for example. If the polymerization or polycondensation reaction occurs at substantially the same time, the process is referred to as "photocured". If only the reaction species are generated by the photoinitiation process and a subsequent step such a heating is required to generate the polymerization or polycondensation, the process is be referred to as "photoinitiated". It should be appreciated that even though a post-cure heat treatment may be necessary to finalize the polymerization step, substantially stable construct features in the negative photoresist polymer may also be created during the initial radiation exposure. The substantially solid radiation-curable polymers can go through just the initiation process and, due to inherent stability and the limited diffusion rate of the chemical species within the solid radiation-curable polymers, the curing process may also be performed much later without significant feature degradation. It should be appreciated that most photoinitiated polymers begin the curing process at the inception of the initiation process, but the kinetics of the reaction at the exposure temperature are so slow that little, if any, polymerization or polycondensation may take place prior to heating the negative resist polymer to a desired curing temperature.

One particular negative resist polymer is the epoxy-based SU-8 2000™, commercially available from Microchem Corporation in Newton, Mass. The SU-8 2000™ negative resist polymer is curable by UV radiation. It should be appreciated that other substantially solid radiation-curable polymers may also be employed.

As a nonlimiting example, the radiation-dissociable materials may include positive resist polymers. Positive resist polymers begin as crosslinked polymers but may contain photoinitiators that, when exposed to a particular radiation, generate chemical species which dissociate the polymer by at least one of breaking the crosslinks and scissioning the polymer backbone. The dissociation makes the positive resist polymer soluble in the regions which have been exposed to the radiation. Regions where the positive resist polymer remains are masked rather than being exposed, as is the case with the negative resist polymers described hereinabove. In certain embodiments, the positive resist polymers are sensitive to radiation, e.g., ultraviolet or electron beam, without the need for photoinitiators. For example, the positive resist polymer may itself be damaged by the radiation and the remaining scissioned chains become soluble in a solvent. Other types of positive resist polymers may be employed, as desired.

The first radiation-sensitive material has a first sensitivity. The second radiation-sensitive material has a second sensitivity different from the first sensitivity. As disclosed herein, the sensitivity with respect to radiation-curable materials is at least one of a curing rate, an initiation rate, a sensitivity to radiation frequency, a sensitivity to radiation amplitude, and a sensitivity to radiation type. The sensitivity with respect to radiation-dissociable materials is at least one of a dissociation rate, a sensitivity to radiation frequency, a sensitivity to radiation amplitude, and a sensitivity to radiation type. It should be appreciated that upon applying 104, 106 the first and second radiation-sensitive materials to the substrate, different radiation-cured constructs may be formed in the first and second radiation-sensitive materials by exposing 110 the first and second radiation-sensitive materials to radiation selected for the respective first and second sensitivities. Radiation-cured structures having a high level of geometrical complexity may thereby be fabricated.

It should further be understood that use of the first radiation-sensitive material having the first sensitivity, and the second radiation-sensitive material sharing the first sensitivity but also having the second sensitivity different from the first sensitivity, is within the scope of the present disclosure.

In a further embodiment, the method 100 may include the step of applying a third radiation-sensitive material to the second radiation-sensitive material. The third radiation-sensitive material has a third sensitivity. The third sensitivity may be the same as or different from one of the first and second sensitivities, as desired. In one example, the third sensitivity is substantially the same as the first sensitivity. In a particular example, the third sensitivity is different from the first and second sensitivities. In a most particular example, the third sensitivity is different from the second sensitivity and substantially the same as the first sensitivity. One of ordinary skill in the art should appreciate that a resulting radiation-cured structure could thereby be formed having layers of substantially the same construct with a layer of a different construct disposed therebetween. It should also be appreciated that any desired number of radiation-sensitive materials in any desired arrangement, for example, laminated or otherwise, may be employed within the scope of the present disclosure.

Following the steps of applying 104, 106 the first and second radiation-sensitive materials to the substrate, the method 100 includes the step of placing 108 at least one mask between the at least one radiation source and the first and second radiation-sensitive materials. In certain embodiments, the mask is provided as an integral part of the radiation source. A plurality of masks and a plurality of radiation sources may be employed. The mask has a plurality of substantially radiation-transparent apertures. In the embodiment also having the third radiation-sensitive material, for example, the mask is placed between the at least one radiation source and the first, second, and third radiation-sensitive materials. It should be appreciated that a first mask and a first radiation source may be disposed on a first side of the first and second radiation-sensitive materials, and a second mask and a second radiation source may be disposed on a second side of the first and second radiation-sensitive materials, as desired.

The material forming the mask may be a substantially radiation-transparent material, such as quartz glass in relation to ultraviolet (UV) radiation, for example. The apertures may be holes or substantially radiation-transparent openings formed in an otherwise opaque, radiation-blocking coating disposed on the substantially radiation-transparent mask material. In one illustrative embodiment, the mask has a plurality of apertures with a diameter of about 10 microns. As further nonlimiting examples, the mask material may include one of crown glass, Pyrex glass, and a polyethylene terephthalate, such as a Mylar® film. The mask may be lifted away after an exposure and cleaned for reuse. Multiple masks with different patterns and types of the plurality of apertures may also be employed. The apertures may have shapes that provide the radiation-cured elements with desired cross-sectional shapes. For example, the apertures may be substantially circular to fabricate radiation-cured elements with elliptical cross-sectional shapes. A skilled artisan may select suitable mask materials, aperture sizes and shapes, and resulting construct configurations, as desired.

The method 100 includes the step of exposing 110 the first and second radiation-sensitive materials to a plurality of radiation beams. The radiation beams are projected through the radiation-transparent apertures in the at least one mask and contact the first and second radiation-sensitive materials. A skilled artisan may select the radiation source to generate electromagnetic radiation or particle radiation, as desired. The radiation beams employed to expose the radiation-sensitive material may be generated by a Mercury arc lamp providing UV radiation beams, for example. One of ordinary skill in the art understands that radiation beams of other wavelengths, such as infrared, visible light, and X-ray radiation, and from other sources, such as incandescent lights and lasers, may also be employed. Particle radiation such as an electron beam from a cathode ray source may also be employed. It should be further understood that the radiation beams may be collimated, partially collimated, or non-collimated, as desired.

The plurality of radiation beams may include a plurality of first radiation beams and a plurality of second radiation beams, for example. In certain embodiments, the first radiation beams may be different from the second radiation beams in at least one of frequency, amplitude, and type. The first and second radiation-sensitive materials may be exposed to the plurality of radiation beams simultaneously or sequentially, as desired. The first radiation beams may be different from the second radiation beams in at least one of cross-sectional shape and angle of incidence relative a surface of one of the first, second, and optionally the third, radiation-sensitive materials. As a further nonlimiting example, the plurality of first radiation beams is provided by a first radiation source having a first mask and the plurality of second radiation beams is provided by a second radiation source having a second mask. Any desired variety of radiation frequencies, radiation amplitudes, radiation types, cross-sectional shapes, angles, masks, and radiation sources may be employed within the scope of the present disclosure.

The steps of applying 104, 106 the first and second radiation-sensitive materials and exposing 110 the first and second radiation-sensitive materials have been described hereinabove with respect to concurrent exposure of first and second radiation-sensitive materials. It should be appreciated that the first and second-radiation sensitive materials may also be exposed in a non-concurrent manner. For example, each of first and second radiation-sensitive materials may be independently applied and then exposed to the radiation beams. As a further example, the first radiation-sensitive material may be first applied and then exposed to the first radiation beams. The second radiation-sensitive material may then applied to the first radiation-sensitive material. The second radiation-sensitive materials may have a heightened sensitivity and be exposed to the second radiation beams for a duration which would not substantially affect the first radiation-sensitive material. In this manner, construct features in the less sensitive first radiation-sensitive material would not be carried through the more sensitive second radiation-sensitive material.

At least one substantially solid radiation-sensitive material may also be employed with at least one liquid radiation-sensitive material. Where concurrent exposure is desired, for example, the substantially solid first radiation-sensitive material may be applied to the substrate. The liquid second radiation-sensitive material is then applied to the substantially solid first radiation-sensitive material. Each of the first and second radiation-sensitive materials may be selected to have a different sensitivity. If the variation in sensitivity between the first and second radiation-sensitive materials is one of rate, then the construct features in the less sensitive radiation-sensitive material would be carried through the more sensitive radiation-sensitive material. The construct features in the more sensitive radiation-sensitive material would not be carried through the less sensitive radiation-sensitive material. If the variation in sensitivity is due to frequency or type of radiation, the construct features that are unique to the first and second radiation-sensitive materials may be generated separately. The construct features that cross the interface boundary between the first and second radiation-sensitive materials may be formed by concurrently exposing the first and second radiation-sensitive materials to both frequencies and/or and types of radiation. For example, the first and second radiation-sensitive materials may be exposed to provide less than a complete cure, the residual uncured material may then be stripped away, and the first and second radiation-sensitive materials concurrently cured for a co-cure at the interface boundary.

Where non-concurrent exposure is desired, the substantially solid first radiation-sensitive material may be applied and then exposed to the radiation beams. The liquid second radiation-sensitive material is then applied to the substantially solid first radiation-sensitive material. Typically, the liquid second radiation-sensitive material may be selected to have the sensitivity greater than the sensitivity of the substantially solid first radiation-sensitive material. Construct features formed in the liquid second radiation-sensitive material do not thereby carry through to the substantially solid first radiation-sensitive material.

One of ordinary skill in the art should understand that the first and second radiation-sensitive materials may include liquid layers with variable depths, for example. As a nonlimiting example, the liquid radiation-sensitive material may be applied to the substrate and subsequently exposed to form desired construct features. Additional liquid radiation-sensitive material may then be added to raise the height of the original liquid radiation-sensitive material. The additional liquid radiation-sensitive material is exposed, and the intensity of the radiation beams and the exposure time controlled such that the new construct features only extend through the new layer of the liquid radiation-curable material. Alternatively, the intensity of the radiation beams and the exposure time may be controlled such that the new construct features extend into the construct features formed in the original liquid radiation-sensitive material.

Following the step of exposing 110 the first and second materials to the plurality of radiation beams, the method 100 includes the step of forming 112 the first and second constructs from the first and second radiation-sensitive materials, respectively. It should be understood that the step of forming 112 the first and second radiation-sensitive materials may directly result from the step of exposing 110 the first and second radiation-sensitive materials to the plurality of radiation beams. Alternatively, the step of forming 112 may further include a post-processing of the first radiation-sensitive material and the second radiation-sensitive material following the step of exposing 110 the first and second radiation-sensitive materials to the plurality of radiation beams. The post-processing may include a heating of the first and second radiation-curable materials, for example. The heating may facilitate at least one of polymerization and crosslinking of at least one of the first radiation-sensitive material and the second radiation-sensitive material when at least one of the first radiation-sensitive material and the second radiation-sensitive material is a radiation-curable material that has undergone a degree of initiation by exposure to the radiation beams. In an alternative embodiment, the heating may facilitate a dissociation of at least one of the first radiation-sensitive material and the second radiation-sensitive material when at least one of the first radiation-sensitive material and the second radiation-sensitive material is a radiation-dissociable material that has undergone a degree of dissociation by exposure to the radiation beams. Suitable temperatures and heating times may be selected as desired.

The first radiation-sensitive material is exposed and forms a first construct in the first radiation-sensitive material. The second radiation-sensitive material is exposed and forms a second construct in the second radiation-sensitive material. Where the third radiation-sensitive material is exposed to the radiation beams, the third radiation-sensitive material forms a third construct. The first construct, second construct, and optionally the third construct, are formed from a plurality of radiation-cured elements and cooperate to form the radiation-cured structure. It should be appreciated that a variety of the radiation-cured elements may be formed according to the present method, including truss elements, radiation-cured sheets, and solid radiation-cured polymer structures, for example.

In a particular embodiment, the radiation-cured structure includes a microtruss structure. The microtruss structure may have a plurality of first truss elements that extend along a first direction, a plurality of second truss elements that extend along a second direction, a plurality of third truss elements that extend along a third direction, and a plurality of fourth truss elements that extend along a fourth direction. The first, second, third, and fourth truss elements may interpenetrate each other at a plurality of nodes. It should be appreciated that the first, second, third, and fourth truss elements may not interpenetrate each other, or may interpenetrate each other at the plurality of nodes on an intermittent basis, as desired. The first, second, third, and fourth truss elements form a continuous, three dimensional, self supporting cellular structure.

Although the microtruss structure with the plurality of first, second, third, and fourth truss elements may have a 4-fold architectural symmetry as described hereinabove, a skilled artisan should appreciate that other architectures for the microtruss structure, such as a 3-fold symmetry and a 6-fold symmetry, may be employed within the scope of the present disclosure. The particular architecture may be selected, for example, to increase the microtruss structure connectivity and reduce susceptibility to bending and buckling of the microtruss structure under a load. The selected architecture may be symmetrical or asymmetrical, as desired. The architecture may also be selected to optimize strength and stiffness of the microtruss structure. One of ordinary skill in the art should further understand that the other architectures for microtruss structure may be employed, as desired.

Exemplary architectures of the microtruss structure are described by Jacobsen in U.S. Pat. No. 7,382,959 and U.S. patent application Ser. No. 11/801,908. For example, the plurality of first truss elements may be defined by a plurality of first self-propagating polymer truss waveguides. The plurality of second truss elements may be defined by a plurality of second self-propagating polymer truss waveguides. The plurality of third truss elements may be defined by a plurality of third self-propagating polymer truss waveguides. The plurality of fourth truss elements may be defined by a plurality of fourth self-propagating polymer truss waveguides. Other suitable means of forming the microtruss structure may be employed as desired.

One of ordinary skill in the art should appreciate that the particular microtruss structure can be designed as desired, for example, by at least one of: 1) selecting the angles and the patterns of the truss elements with respect to one another, 2) adjusting the packing, or relative density of the resulting cellular structure, and 3) selecting the cross-sectional shapes and dimensions of the truss elements. In particular, truss elements having an elliptical truss cross-sectional shape may militate against degradation with differences in coefficient of thermal expansion. Other cross-sectional shapes may also be employed, as desired.

It should be appreciated that the radiation-cured structure according to the present disclosure may be fabricated by the combined use of radiation-curable materials and radiation-dissociable materials. For example, the radiation-cured structure may be formed from both of a negative resist and a positive resist as described hereinabove. Each of the negative and positive resists may be applied adjacent one another in an uncured state. The negative and positive resists may be selected to have different radiation sensitivities. The negative resist may be photoinitiated or at least partially cured during the step of exposing 110 the negative resist to the radiation beams. Following the exposure of the negative resist to form the construct features, and the removal of residual uncured material, the uncured positive resist and the negative resist may be co-cured. The negative resist construct features are thereby allowed to crosslink with the positive resist at the interface boundary. The positive resist is then exposed to radiation beams to dissociate the positive resist material in desired regions without affecting the construct formed in the negative resist. The radiation-cured structure may thereby be formed from both of the first radiation-curable material and the second radiation-dissociable material.

The method 100 of the present disclosure may further include the step of removing an uncured portion of the first and second radiation-sensitive materials. It should be appreciated that the term "uncured radiation-sensitive material" may also include dissociated radiation-sensitive material within the scope of the present disclosure. The uncured portion may be a residual portion of the first and second radiation-curable materials that was uncured following the exposure to the radiation beams, or a portion of the first and second radiation-dissociable materials that was scissioned or otherwise made solvent-soluble by the exposure to the radiation beams. The step of removing the uncured portion typically occurs following at least one of the step of exposing 110 the first and second radiation-sensitive materials to the plurality of radiation beams to cure the first and second radiation-sensitive materials. As a nonlimiting example, the step of removing the uncured portion of the first and second radiation-sensitive materials may include rinsing the radiation-cured structure with the solvent. One of ordinary skill in the art should appreciate that suitable solvents do not substantially degrade the exposed radiation-cured structure during the step of removing the uncured portion of the first and second radiation-sensitive materials.

It should be understood that, following the fabrication of the radiation-cured structure, the radiation-cured structure may be further processed to enhance at least one of a strength, an electrical conductivity, and an environmental resistance thereof. As nonlimiting examples, the method of the present disclosure may further include at least one of the steps of metalizing, carbonizing, and ceramicizing the radiation-cured structure. Composites including the radiation-cured structure may also be formed, for example, as disclosed in U.S. application Ser. No. 12/008,479 to Jacobsen et al., hereby incorporated herein by reference in its entirety.

In one embodiment, the radiation-cured structure may be metalized by plating the radiation-cured elements with a metal coating. The metal coating may be substantially oxidation resistant, reduction resistant, and acid-resistant, for example. The metal coating may include a noble metal selected from the group consisting of: ruthenium (Ru), rhodium (Rh), palladium (Pd), silver (Ag), iridium (Ir), platinum (Pt), and osmium (Os), and alloys thereof, for example. In a particular embodiment, the metal coating is gold (Au). In another particular embodiment, the metal coating is tantalum (Ta). Another suitable metal coating may include nickel (Ni) alloys, such as alloys of nickel (Ni) and chromium (Cr) or nickel (Ni) and cobalt (Co). As should be recognized by one of ordinary skill in the art, the metal coating may include mixtures or alloys of the above identified metals. Other electrically conductive metals and materials may also be employed, as desired.

The metal coating may be deposited onto the radiation-cured structure by at least one of electron beam evaporation, magnetron sputtering, physical vapor deposition, chemical vapor deposition, atomic layer deposition, electrolytic deposition, electroless deposition, flame spray deposition, brush plating, and other like processes. Solution based electroplating techniques that include immersing the radiation-cured structure in a plating bath may also be employed. Application of metal in the form of a slurry powder and subsequently firing the slurry powder to form the metal coating may also be used. A skilled artisan may select more than one deposition technique to take into account differences between line of sight and non-line of sight characteristics of the deposition techniques selected. In certain embodiments, the metal coating may be substantially evenly deposited on both the interior and exterior surfaces of the radiation-cured structure. Suitable means for metalizing the radiation-cured structure may be selected as desired.

One of ordinary skill in the art should understand that the radiation-cured structure may be carbonized. The carbonization of the radiation-cured structure may cause the radiation-cured structure to become electrically conductive. Open-cellular carbon structures and a method of making the same from a polymer template material is disclosed by Jacobsen in U.S. patent application Ser. No. 11/870,379, the disclosure of which is hereby incorporated herein by reference in its entirety. Other suitable methods for carbonizing the radiation-cured structure may also be used.

It should be appreciated that the radiation-cured structure may be ceramicized by coating the radiation-cured structure with a suitable metal oxide or ceramic. In certain illustrative embodiments, at least a portion of the radiation-cured structure may be coated with the metal oxide or the ceramic to provide the desirable level of bending strength and electrical conductivity. Suitable ceramic structures and methods for ceramicizing radiation-cured structures are disclosed by Gross et al. in U.S. patent application Ser. No. 12/074,727, the entire disclosure of which is hereby incorporated herein by reference. Other suitable methods for ceramicizing the radiation-cured structure may also be used.

The method 100 of the present disclosure may include the step of applying a filter layer between the first radiation-sensitive material and the second radiation-sensitive material. The filter layer may be a layer of another radiation-sensitive material that is substantially opaque to the radiation to which the first and second radiation-sensitive materials are sensitive. Illustratively, the filter layer militates against an exposure of the second radiation-sensitive material to at least a portion of the plurality of radiation beams when the first radiation-sensitive material is exposed. In particular instances, the filter layer is an optical filter layer. For example, the filter layer may be disposed between the first radiation-sensitive material and the second radiation-sensitive material. The filter layer may thereby militate against radiation beams of select frequency, amplitude, or type from causing a formation of the first construct in the first radiation-sensitive material when the second radiation-sensitive material is exposed to the radiation beams from the radiation source. The filter layer may also have a radiation sensitivity different from the sensitivity of the first and second radiation-sensitive materials. Therefore, another construct of the radiation-cured structure may also be formed in the filter layer, as desired.

The embodiments of the invention shown in FIGS. 2 and 3 are similar to the embodiment shown in FIG. 1 except as described below. For purpose of clarity, like steps from FIG. 1 shown in FIGS. 2 and 3 are repeated with the same reference numerals in the 200s and 300s instead of the 100s.

As shown in FIG. 2, the first radiation-curable material has the first sensitivity and the second radiation-curable material has the second sensitivity different from the first sensitivity. The method 200 includes the steps of providing 202 the substrate; applying 204 the first radiation-curable material to the substrate; applying 206 the second radiation-curable material to the first radiation-curable material; placing 208 at least one mask between the at least one radiation source and the first and second radiation-curable materials; and exposing 210 the first and second radiation-curable materials to the plurality of radiation beams through the radiation-transparent apertures in the at least one mask. The method 200 includes the step of curing 212 the first and second radiation-curable materials having the different first and second sensitivities. The first construct in the first radiation-curable material and the second construct in the second radiation-curable material are thereby fabricated and cooperate to form the radiation-cured structure. It should be further appreciated that the first radiation-curable material may be at least partially uncured at the interface boundary with the second radiation-curable material prior to the curing 212 of the second radiation-curable material. Following a stripping away of uncured radiation-curable material, the first and second radiation-curable materials may be concurrently cured to generate bonds at the interface boundary. The at least partial undercure of the first radiation-curable material prior to the curing 212 of the second radiation-curable material may improve the adhesion of the first construct to the second construct. It should be further appreciated that the difference in sensitivities between the first radiation-curable material and the second radiation-curable material allows the first construct in the first radiation-sensitive material to be formed before the second construct in the second radiation-sensitive material, or vice-versa, as desired.

In an illustrative example, the first and second radiation-curable materials are selected to have different sensitivities to radiation frequency. In a particular embodiment, the first and second radiation-curable materials are photoinitiated polymers. The first and second radiation-curable materials may be applied together and each have a sensitivity to a different frequency of radiation, for example The first and second radiation-curable materials may be exposed to the different frequencies of radiation either simultaneously or in progression. After the features of the first and second constructs are initiated within the first and second radiation-curable materials, for example, each of the first and second radiation-curable materials may be simultaneously heated to the desired curing temperature. The heating may cause at least one of the polymerization and the crosslinking of the first and second constructs to proceed. Since each of the first and second constructs are cured at the same time, the construct features which cross the interface between the first and second radiation-curable materials are able to carry the polymerization or crosslinking across the interface boundary. A desirable level of adhesion between the first and second constructs may thereby be provided.

In another embodiment, the first and second radiation-curable materials are photocured polymers. If all of the construct features for each of the first and second radiation-curable materials are exposed at substantially the same time, the reactions in each of the first and second radiation-curable materials occur substantially simultaneously and the polymerization reactions is carried across the interface boundaries between the first and second radiation-curable materials.

Where the construct features cannot all be exposed at the same time due to limitations of the masking or radiation sources, for example, the construct features in each of the first and second radiation-curable materials that do not tie into the other of the first and second radiation-curable materials may be formed separately. The construct features which do cross the boundary may be concurrently formed in the first and second radiation-curable materials on each side of the boundary. It should be appreciated that these restrictions may not be as severe if one of the first and second radiation-curable materials does not fully cure during the exposure process, for example, as described hereinabove.

In another illustrative example, the first and second radiation-curable materials are selected to have different initiation rates. It should be understood that the photoinitiation process of the present method 200 may be a function of at least one of the radiation intensity and exposure time. Either may be varied to change the exposure. Features of the construct formed in one of the first and second radiation-curable materials with a slower initiation rate, for example, are desirably carried into the adjacent one of the first and second radiation-curable materials with the faster initiation rate. Additional construct features may be added to the one of the first and second radiation-curable materials with the faster initiation rate, for example. Following the initiation process, the first and second constructs may be cured by increasing the temperature of the first and second radiation-curable materials. In order to allow construct features to cross the interface boundaries, it should be understood that all features must be initiated prior to the beginning of the curing process.

In a further illustrative example, the first and second radiation-curable materials are selected to have a different cure rate. The processing of the first and second radiation-curable materials with the different cure rate may be very similar to processing of the first and second radiation-curable materials with the different initiation rate. It should be appreciated that the curing of the first and second constructs happens during exposure. Like effects with regard to speed of the curing apply, however. The construct features formed in one of the first and second radiation-curable materials with the slower cure rate are desirably carried through the one of the first and second radiation-curable materials with the faster cure rate, for example. The one of the first and second radiation-curable materials with the faster curing rate may contain additional features, as desired.

In an additional illustrative example, the first and second radiation-curable materials are selected to have a different sensitivity to the type of radiation. As described hereinabove, a multitude of radiation types may be use to initiate the curing reaction. Typically, the curing (e.g., at least one of initiation, polymerization, and crosslinking) will be initiated by some form of electromagnetic radiation. In addition, however, other types of radiation such as particle beam radiation can also be used to initiate the curing.

For a photoinitiated polymer system, where the first and second radiation-curable materials also have different sensitivities to the radiation type, the process is similar to the process for varying the frequency of the radiation. The first and second radiation-curable materials are each applied and have the sensitivity to the different type of radiation. The first and second-radiation-curable materials may then be exposed to the different kinds of radiation, either simultaneously or in progression. After the construct features within the first and second radiation-curable materials are initiated, each of the first and second radiation-curable material are simultaneously heated to the curing temperature where polymerization and/or crosslinking of all construct features occur. Since the construct features are formed at substantially the same time, the construct features which cross the interface boundary between the first and second radiation-curable materials desirably carry the polymerization and/or crosslinking across the interface boundary.

For a photocured polymer system, where each of the construct features for the first and second radiation-curable materials can be exposed at substantially the same time, the curing in the first and second radiation-curable materials can occur simultaneously. The resulting polymerization reactions can thereby be carried across the interface boundary between the first and second radiation-curable materials. Where the construct features cannot all be exposed at substantially the same time due to limitations of the masking or radiation sources, for example, the construct features in the first radiation-curable material that do not tie into the second radiation-curable material may be formed separately. The construct features which do cross the interface boundary may be concurrently formed in the first and second radiation-curable materials on each side of the interface boundary.

As shown in FIG. 3, the first radiation-dissociable material has a first sensitivity and the second radiation-dissociable material has a second sensitivity different from the first sensitivity. The method 300 includes the steps of providing 302 a substrate; applying 304 the first radiation-dissociable material to the substrate; applying 306 the second radiation-dissociable material to the first radiation-dissociable material; placing 308 at least one mask between the at least one radiation source and the first and second radiation-dissociable materials; and exposing 310 the first and second radiation-dissociable materials to the plurality of radiation beams through the radiation-transparent apertures in the at least one mask. The method 300 further includes the step of dissociating 312 the first and second radiation-dissociable materials having the different first and second sensitivities. The first construct in the first radiation-dissociable material and the second construct in the second radiation-dissociable material are thereby formed and cooperate to form the radiation-cured structure. It should be appreciated that the difference in sensitivities between the first radiation-dissociable material and the second radiation-dissociable material allows the first construct in the first radiation-sensitive material to be formed before the second construct in the second radiation-sensitive material, or vice-versa, as desired.

In an illustrative example, the first and second radiation-dissociable materials are selected to have a different sensitivity to radiation frequency. Where the first and second radiation-dissociable materials are positive resists, for example, the first and second radiation-dissociable materials desirably are fully cured and crosslinked together prior to the step of exposing 310 the first and second radiation-dissociable materials to the radiation beams. The desired construct features may thereby be carried across interface boundary between the first and second radiation-dissociable materials. It should be understood that the first and second radiation-dissociable materials may be exposed to the radiation beams having the different frequencies in any order, and then the exposed regions can be dissolved by the solvent to leave the desired first and second constructs.

In another illustrative example, the first and second radiation-dissociable materials are selected to have different dissociations rate. It should be appreciated that, where the rates of dissociation of the first and second radiation-dissociable materials are different, complex constructs can be generated. One of ordinary skill in the art understands that the holes generated by the step of exposing 310 one of the first and second radiation-dissociable materials with the slowest dissociation rate will be carried through the entire resulting radiation-cured structure. Additional material may be removed from the one of the first and second radiation-dissociable materials with the faster dissociation rate without significantly affecting the other of the first and second radiation-dissociable materials with the slower dissociation rate. However, a significant difference in the respective dissociation rates is generally desirable. As nonlimiting examples, where there are only two radiation-dissociable materials, a difference in dissociation rates of about 10:1 may be sufficient; where there are three radiation-dissociable materials, a different in dissociation rates of about 100:1 may be sufficient; and where there are more than three radiation-dissociable materials, a difference in dissociation rates of about 10,000:1 may be sufficient. The respective dissociation rates of the radiation-dissociable materials may be selected, as desired.

In a further illustrative example, the first and second radiation-dissociable materials may be selected to have different sensitivities to the type of radiation. The forming of the radiation-cured structure from the first and second radiation-dissociable materials with sensitivities to different types of radiation may be similar to the method for different sensitivity to frequency, described hereinabove. As a nonlimiting example, the first radiation-dissociable material may be sensitive to electromagnetic radiation and the second radiation-dissociable material may be sensitive to particle beam radiation. It should be appreciated, however, that the first radiation-dissociable material that is sensitive to the electromagnetic radiation is desirably selected to have minimal sensitivity to the particle beam radiation, and vice versa.

It is surprisingly found that the selective exposure of laminated radiation-sensitive materials, according to the methods 100, 200, 300 of the present disclosure, minimizes production costs and fabrication time of radiation-cured structures. By grouping all the lamination operations together, the fabrication of complex radiation-cured structures can now be performed on a same line and in a same facility. Exposing the different radiation-sensitive materials to the plurality of radiation beams can be conducted by turning masked radiation sources on without moving the radiation-sensitive materials. The methods 100, 200, 300 thereby militate against misalignment and tolerance concerns that typically may result from repeated positioning of masks and radiation-sensitive materials. The radiation-cured structure of the present disclosure may also be fabricated without the need for planarizing, as is performed in electromechanical fabrication. A single cleaning operation may also be employed to remove uncured radiation-sensitive materials following fabrication of the radiation-cured structure. Likewise, single metallization, carbonization, and ceramicization operations may be used to make the radiation-cured structure to provide the radiation-cured structure with desired characteristics.

While certain representative embodiments and details have been shown for purposes of illustrating the invention, it will be apparent to those skilled in the art that various changes may be made without departing from the scope of the disclosure, which is further described in the following appended claims.

What is claimed is:
1. A method for fabricating a radiation-cured structure, the method comprising the steps of:
   providing a first radiation-sensitive material, the first radiation-sensitive material having a first sensitivity to one of radiation frequency and radiation type prior to exposure to a plurality of radiation sources, wherein the plurality of radiation sources includes a first radiation source and a second radiation source;
   applying a second radiation-sensitive material to the first radiation-sensitive material, the second radiation-sensitive material having a second sensitivity to one of radiation frequency and radiation type that is different from the first sensitivity prior to exposure to the radiation sources, the second radiation-sensitive material different from the first radiation-sensitive material;
   placing at least one mask between the radiation sources and the first and second radiation-sensitive materials, the mask having a plurality of substantially radiation-transparent apertures;
   exposing the first and second radiation-sensitive materials to a plurality of radiation beams through the radiation-transparent apertures in the mask, wherein the plurality of radiation beams include a plurality of first radiation beams projected from the first radiation source and a plurality of second radiation beams projected from the second radiation source, and wherein the plurality of first radiation beams is different from the plurality of second radiation beams in one of radiation frequency and radiation type, the first radiation beams selected for the first sensitivity of the first radiation-sensitive material and the second radiation beams selected for the second sensitivity of the second radiation-sensitive material; and
   forming at least a first construct in the first radiation-sensitive material and a second construct in the second radiation-sensitive material, wherein the difference between the first sensitivity of the first radiation-sensitive material and the second sensitivity of the second radiation-sensitive material results in the first construct being different from the second construct, the first construct and the second construct cooperating to form the radiation-cured structure.

2. The method of claim 1, wherein at least one of the first and second radiation-sensitive materials is one of a radiation-curable material and a radiation-dissociable material.

3. The method of claim 1, further comprising the step of removing an uncured portion of the first and second radiation-sensitive materials following the step of exposing the first and second radiation-sensitive materials to the plurality of radiation beams.

4. The method of claim 1, further comprising the step of applying a third radiation-sensitive material to the second radiation sensitive material, the third radiation-sensitive material having a third sensitivity to one of radiation frequency and radiation type.

5. The method of claim 4, wherein the third radiation-sensitive material forms a third construct following the step of exposing the third radiation-sensitive material to the plurality of radiation beams, the third construct cooperating with the first construct and the second construct to form the radiation-cured structure.

6. The method of claim 4, wherein the third sensitivity is substantially the same as the first sensitivity.

7. The method of claim 4, wherein the third sensitivity is different from the first sensitivity and the second sensitivity.

8. The method of claim 1, further comprising the steps of providing a substrate and applying the first radiation-sensitive material to the substrate.

9. The method of claim 1, further comprising at least one of the steps of metalizing, carbonizing, and ceramicizing the radiation-cured structure.

10. The method of claim 1, wherein the plurality of first radiation beams is different from the plurality of second radiation beams in at least one of cross-sectional shape and angle of incidence relative a surface of one of the first radiation-sensitive material and the second radiation-sensitive material.

11. The method of claim 10, wherein the plurality of first radiation beams is provided by the first radiation source having a first mask and the plurality of second radiation beams is provided by the second radiation source having a second mask.

12. The method of claim 11, wherein at least one of the first radiation-sensitive material and the second radiation-sensitive material is one of a negative resist and a positive resist.

13. The method of claim 11, wherein at least one of the first radiation-sensitive material and the second radiation-sensitive material is a liquid photomonomer.

14. The method of claim 11, wherein the forming step includes the step of heating the first radiation-sensitive material and the second radiation-sensitive material following the step of exposing the radiation-sensitive material to the plurality of radiation beams, the heating facilitating at least one of polymerization, a crosslinking, and a dissociation of at least one of the first radiation-sensitive material and the second radiation-sensitive material.

15. The method of claim 1, further comprising the step of applying a filter layer between the first radiation-sensitive material and the second radiation-sensitive material, the filter layer militating against an exposure of one of the first and second radiation-sensitive materials to at least a portion of the plurality of radiation beams.

16. A method for fabricating a radiation-cured structure, the method comprising the steps of:

providing a first radiation-curable material, the first radiation-curable material having a first sensitivity to one of radiation frequency and radiation type prior to exposure to a plurality of radiation sources, the first sensitivity including one of a sensitivity to a first radiation frequency and a sensitivity to a first radiation type, wherein the plurality of radiation sources includes a first radiation source and a second radiation source;

applying a second radiation-curable material to the first radiation-curable material, the second radiation-curable material having a second sensitivity to one of radiation frequency and radiation type prior to exposure to the radiation sources, the second radiation-sensitive material different from the first radiation-sensitive material, the second sensitivity including one of a sensitivity to a second radiation frequency and a sensitivity to a second radiation type, the second sensitivity different from the first sensitivity;

placing at least one mask between the radiation sources and the first and second radiation-curable materials, the mask having a plurality of substantially radiation-transparent apertures;

exposing the first and second radiation-curable materials to a plurality of radiation beams through the radiation-transparent apertures in the mask, wherein the plurality of radiation beams include a plurality of first radiation beams projected from the first radiation source and a plurality of second radiation beams projected from the second radiation source, the first radiation beams selected for the first sensitivity of the first radiation-curable material and the second radiation beams selected for the second sensitivity of the second radiation-curable material; and forming at least a first construct in the first radiation-curable material and a second construct in the second radiation-curable material, wherein the difference between the first sensitivity of the first radiation-sensitive material and the second sensitivity of the second radiation-sensitive material results in the first construct being different from the second construct, the first construct and the second construct cooperating to form the radiation-cured structure.

17. The method of claim 16, wherein both the first radiation-curable material and the second radiation-curable material are exposed to the first radiation beams and the second radiation beams, the first radiation beams cause the first construct to be formed in the first radiation-curable material, the second radiation beams cause the second construct to be formed in the second radiation-curable material, and at least one of a) the first radiation beams do not cause construct features to form in the second radiation-curable material, and b) the second radiation beams do not cause construct features to form in the first radiation-curable material.

* * * * *